(12) United States Patent
Meixner

(10) Patent No.: US 6,381,446 B1
(45) Date of Patent: Apr. 30, 2002

(54) CONTROLLABLE FILTER

(75) Inventor: Michael Meixner, Nuremberg (DE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/365,414

(22) Filed: Aug. 2, 1999

(30) Foreign Application Priority Data

Aug. 7, 1998 (DE) .......................... 198 35 893

(51) Int. Cl.[7] ................................ H04B 1/48
(52) U.S. Cl. .......................... 455/82; 455/83
(58) Field of Search .................. 455/552, 553, 455/426, 63, 73, 78, 82, 83; 333/101, 100

(56) References Cited

U.S. PATENT DOCUMENTS 4,980,660 A * 12/1990 Nakamura et al. ............ 455/78
5,881,369 A    3/1999 Deans et al.
5,896,562 A * 4/1999 Heinonen .................. 455/553
6,249,687 B1 * 6/2001 Thomsen et al. ........... 455/553

FOREIGN PATENT DOCUMENTS

EP    0 678 974 A2   10/1995
EP    0 700 167 A1    3/1996

* cited by examiner

*Primary Examiner*—Nguyen T. Vo
(74) *Attorney, Agent, or Firm*—Nixon & Vanderhye P.C.

(57) ABSTRACT

The application relates to a controllable filter (1) that is placed between an antenna on the one side and a receiver and transmitter on the other, where the receiver branch can be switched between two filter characteristics. In this way, a simple device for allowing simplex reception in the transmission band can be provided. This filter is preferably applied as a frontend filter (FP) in the fixed part of a cordless telephone system and/or in a mobile station to thereby provide said mobile station with walkie-talkie capabilities.

15 Claims, 7 Drawing Sheets

CONTROLLABLE FILTER

BACKGROUND OF THE INVENTION

The present invention relates to a controllable filter for being interposed between an antenna on the one side and a receiver and a transmitter on the other side, such as a frontend filter for a communication device, for example a radio telephone apparatus.

Recently, telephone systems that combine cellular telephone capabilities and cordless telephone capabilities have been proposed. Such an arrangement is schematically shown in FIG. 5. As can be seen in FIG. 5, the cordless telephone system (CTS) consists of a so-called fixed part FP and a mobile hand-set MS. Communication between the fixed part PP and the mobile hand-set is conducted along an uplink band, which is associated with the transmitter TX of the mobile part and the receiver RX of the fixed part. Equally, a down-link band is provided, which is distinct from the up-link band, with which the transmitter TX of the fixed part FP and the receiver RX of the mobile part is associated.

Furthermore, the mobile part MS can also communicate with the base transceiver station BTS that belongs to a cellular network. Such a dual-mode hand-set will typically be controlled to communicate with the fixed part of the cordless system when in range of said fixed part, and otherwise to communicate with the cellular system. In this way, a user of the hand-set can take advantage of the lower costs associated with the cordless phone that is attached to the PSTN (public switched telephone network) when in range of the fixed part of the cordless phone, and otherwise to nonetheless always have an operable telephone, at least as long as the user is in range of a base transceiver station BTS.

Regarding the communication bands for the base transceiver station BTS and the mobile hand-set MS, these correspond exactly to those between the mobile hand-set MS and the fixed part FP of the cordless telephone system, as can again be seen from FIG. 5. It may be noted that the term "up-link" in the context of this application describes communication from the mobile device, and the term "down-link" describes communication to the mobile device.

In the above described type of system, a close monitoring and sophisticated selection of operating frequencies is required, such that the communication between a given mobile station MS and a cordless fixed part does not interfere with the communication in the cellular system. Conventionally, this type of frequency management is handled by the mobile station, which receives corresponding information from the base transceiver station, as indicated by a dashed line arrow along the down-link from the base transceiver station to the mobile station in FIG. 5. The mobile station then correspondingly informs the fixed part, as indicated by a dashed line arrow along the uplink between the mobile station and the fixed part.

PROBLEM UNDERLYING THE INVENTION

This conventional approach, however, has a problem in that interference can nonetheless occur, namely if a rearrangement of the cellular frequencies takes place while there is no mobile station logged on to the cordless telephone system, and consequently the fixed part of said cordless telephone system cannot be informed of the rearrangement. In this case, the fixed part will continue to transmit on the same beacon channel (which is the CTS equivalent of the broadcast control channel BCCH in GSM) and thereby possibly interfere with the traffic on the cellular network.

It is therefore desirable to enable the fixed part FP of the cordless telephone system to also receive information from the base transceiver station. One possibility of achieving such a communication is indicated in FIG. 6, in which the fixed part receives an additional receiving capability in the down-link band to thereby be able to also receive downlink transmissions sent out by the base transceiver stations.

OBJECT OF THE INVENTION

It is the object of the present invention to provide a device for enabling the above described type of communication, which at the same time is low in cost and efficient.

SUMMARY OF THE INVENTION

This object is solved by a controllable filter for being interposed between an antenna on the one side and a receiver and a transmitter on the other side, having a first terminal leading to the antenna, a second terminal leading to the receiver and a third terminal leading to the transmitter, wherein the controllable filter is capable of being controlled to selectively provide at least a first and a second filter characteristic with respect to frequency between said first terminal and said second terminal.

The basic structure of the invention is shown in FIG. 8, in which 1 denotes the controllable filter, 2 an antenna, 3 a receiver, 4 a transmitter, 12 the first terminal or antenna terminal, 13 the second terminal or receiver terminal, 14 the third terminal or transmitter terminal, 5 a control circuit and 51 a control signal.

As can be seen, the basic concept of the invention consists in splitting the signal from or to the antenna along three paths of filtering characteristics, where two of said three paths are recombined. More specifically, as can be seen, the control signal 51 determines if the uplink path between terminals 12 and 13 or the downlink path is selected, where each path has its own frequency characteristic. In this way, e.g. a fixed part of a cordless telephone using such a filter as a frontend filter has a reception and transmission capacity in the downlink band, and also retains its reception capability in the uplink band, but nonetheless only requires one receiver and one transmitter. In other words, in a communication device using the above mentioned filter, a simplex operation (listen mode) can be provided, such that no additional receiving or transmitting means are necessary.

It should be noted that the above described filter device is not restricted to being applied in the fixed part of a cordless telephone system. Much rather, the application to any communication system that may advantageously employ the above mentioned simplex listening operation is possible. For example, another advantageous application of the controllable filter of the present invention is in mobile hand-sets that function in accordance with any given mobile standard, where the use of the filter of the invention as a front-end filter allows the providing of a walkie-talkie function, i.e. two hand-sets may directly communicate with one another without the intervention of the cellular system. This is again achieved by not adding a second receiver and second transmitter to the mobile station, but by letting the mobile station aquire receiving and transmission capability in one common band, for instance by a second receiving path in the uplink band.

BRIEF DESCRIPTION OF FIGURES

The present invention will be better understood from the description of detailed embodiments, where said description refers to attached figures, in which.

DETAILED DESCRIPTION OF EMBODIMENTS

Figure 8:
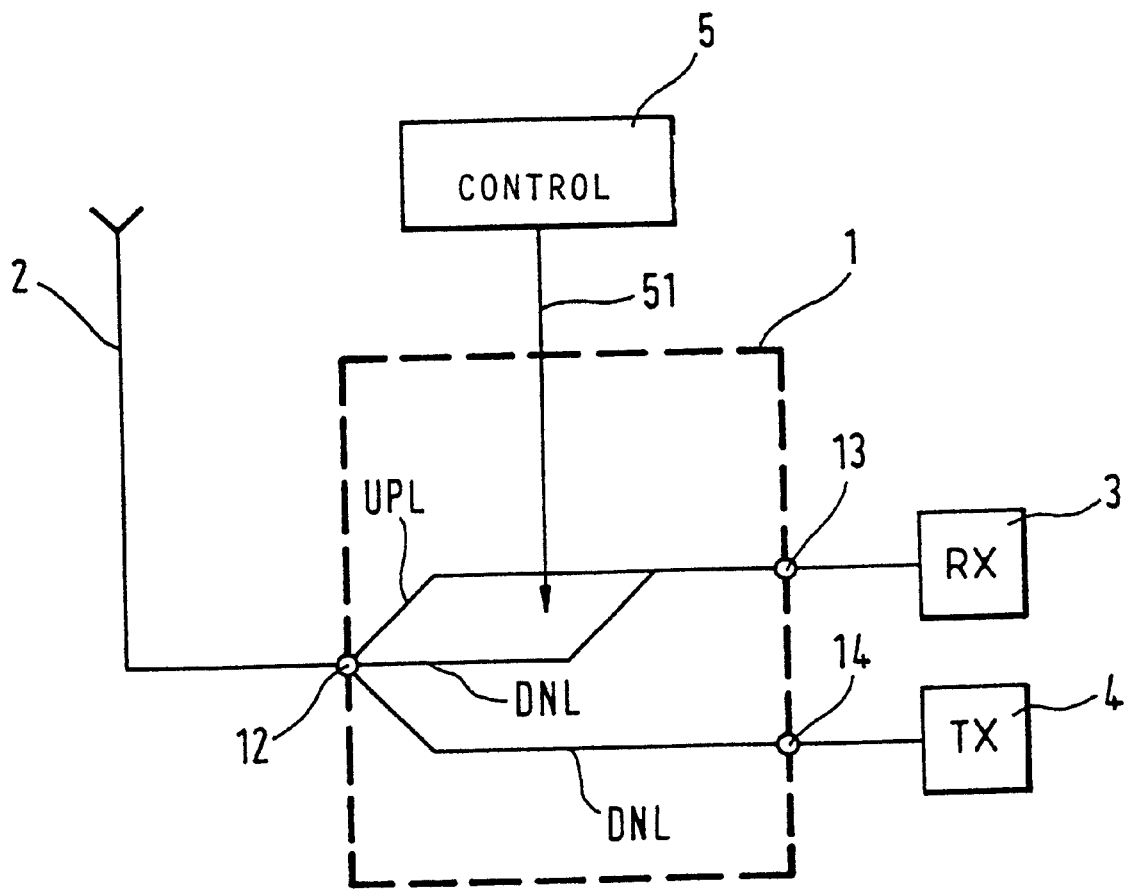
FIG. 8 shows a basic structure of the present invention.

In the following, numerous embodiments of the basic filter construction shown in FIG. 8 will be presented. In terms of components, the present invention preferably employs duplex filters, which for themselves are known, and actively controlled switches, such as transmission/reception switches (T/R-switches), which are also for themselves known in the field of filter construction.

Figure 7A:
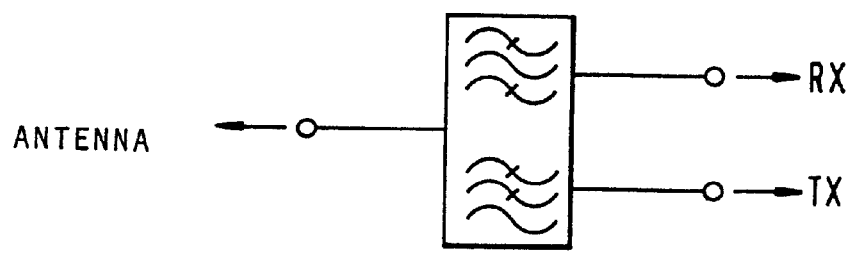
FIG. 7a schematically shows a duplex filter.
Figure 7B:
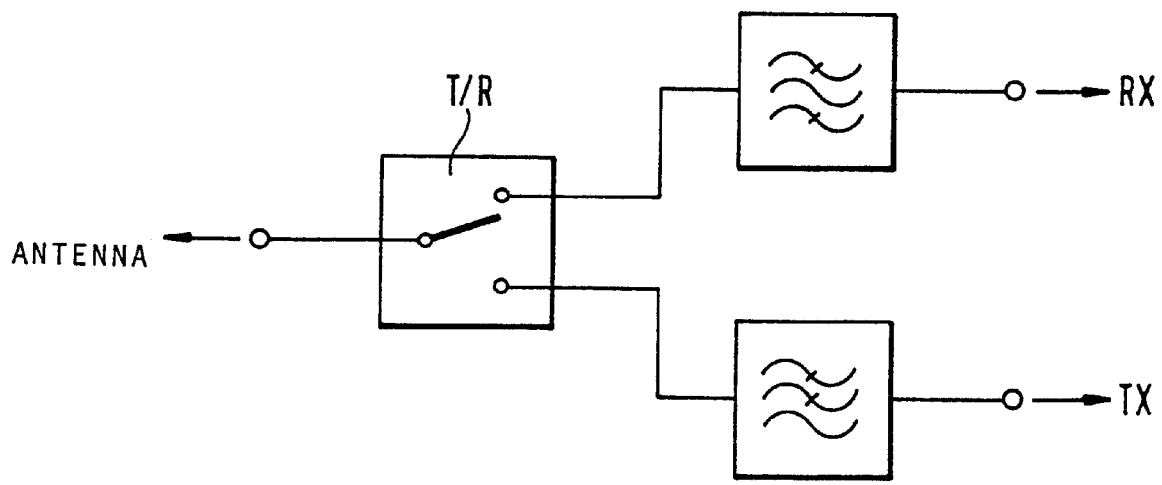
FIG. 7b schematically shows an actively switched filter.

A duplex filter is schematically shown in FIG. 7a and a conventional frontend filter using a T/R-switch and separate filters is shown in FIG. 7b. The duplex filter of FIG. 7a has a band-pass characteristic between the antenna and the receiver, and a low-pass characteristic between the antenna and the transmitter. As can be seen, the duplex filter is not actively controlled and provides two functions in one, namely it filters and splits the signal. In the context of this specification, the term duplex filter will refer to any construction having these properties.

In the arrangement shown in FIG. 7b, the splitting is achieved by the T/R-switch and the filtering by the separate, individual filters, which as in the case of FIG. 7a provide a band pass characteristic in the reception branch and a low pass characteristic in the transmission branch.

The strengths of the duplex filter lie in the good isolation of the transmission and reception branches, a matching to 50 Ω, such that little external components are required, and the already mentioned double function of filtering and splitting. Weak points of the duplex filter lie in elevated component costs. Strengths of the actively switched filter of FIG. 7b, where the T/R-switch e.g. uses PIN diodes as switching elements, are a low insertion loss, low component costs and flexibility due to the use of two separate filters for the transmission branch and reception branch, respectively. The weakness lies in the low isolation of the two branches, which typically requires additional circuitry.

Figure 1:
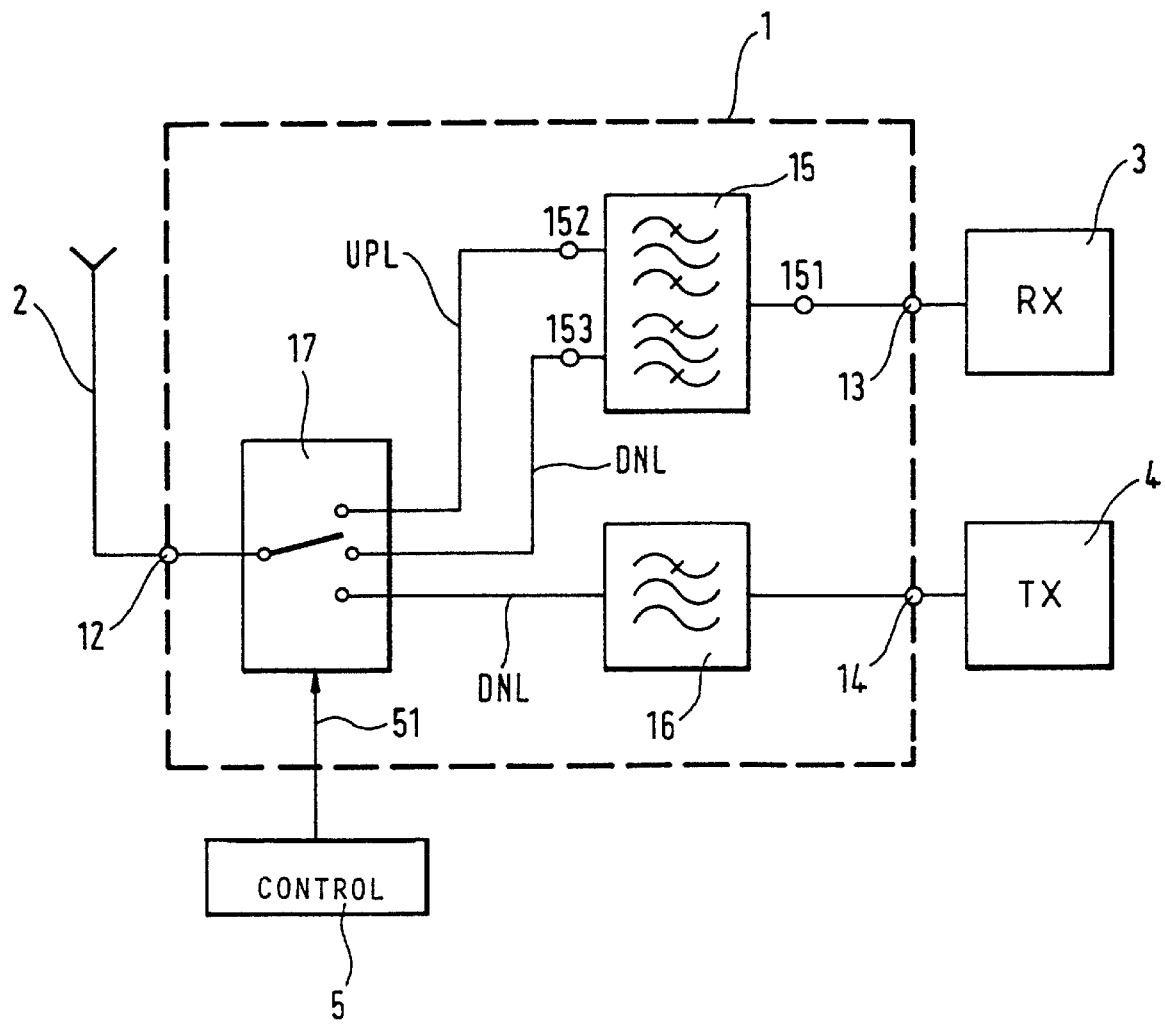
FIG. 1 shows a first embodiment of the present invention.

A first embodiment of the present invention is shown in FIG. 1. Elements that correspond to those already shown in FIG. 8 carry the same reference numeral and shall not be described again. As can be seen, the first embodiment uses a controllable switching means 17 for splitting the antenna connection 12 into three branches, and uses a duplex filter 15 for re-combining the two branches that relate to reception, i.e. an up-link reception branch and a down-link reception branch. Moreover, a filter 16 is provided, for producing the desired filter characteristic between the antenna terminal 12 and the transmitter terminal 14 of the controllable filter 1.

Preferably, the filter characteristic of filter 16 is such that it overlaps with the filter characteristic in the downlink branch leading to the receiver 3, i.e. the filter characteristic between terminals 151 and 153 of duplex filter 15. Examples for the different characteristics in the case of a dual-mode cordless and cellular system in accordance with GSM are that the filter between terminals 151 and 152 provides a band-pass characteristic centered around 902,5 MHz, that the filter characteristic between terminals 151 and 153 is a band-pass characteristic centered around 947,5 MHz and that the filter characteristic of filter 16 is a low-pass with a threshold of 960 MHz. It should, however, be noted that these are only examples in the context of the present embodiment, and that the filter of the present invention can use any suitable or desirable filter characteristic in the given branches, depending on the problem at hand. However, due to the fact that the preferred application of the present invention is to a fixed part of a cordless telephone system and/or a mobile station, it is preferable that the individual elements and circuits be designed to function in an RF frequency range from 500 MHz to 6000 MHz.

The switching element 17 can be any suitable or desirable circuit fulfilling the basic requirements for signal splitting. For example, a switch using PIN-diodes as switching elements is possible, in which case the control signal is an appropriate current to each of the diodes, or GaAs FETs can be used as switching elements, in which case an appropriate gate voltage is used as a control signal for setting the transistors in a transmitting or blocking state. It may be noted that both of these switching techniques are well known in the art and therefore need not be repeated here.

Equally, the individual filters 15, 16 may be given in any suitable or desired way, e.g. in accordance with known techniques for given frequency ranges. For example, in the above mentioned frequency range around 1000 MHz SAW-filters (Surface Acoustic Wave filters) are well known and suitable. Naturally, any other suitable technique for the given frequency range can be employed, as the invention is not restricted or directed to a specific type of filter technology.

Due to the use of duplex filter 15 in the structure of the first embodiment, i.e. a passive filter that fulfills the dual function of splitting and filtering, the employment of splitting switches on both sides of filter 1 is not necessary. In other words, if in place of filter 15 two separate filters of the same type as filter 16 were to be used, then an additional controlled switch would have to be introduced at terminal 13, because otherwise a direct connection of two such separate filters having different filter characteristics would lead to an undetermined performance, because the port impedance of an individual filter is only specified inside its pass-band. Additionally, in the event that switches using PIN,diodes were to be used in the above mentioned hypothetical construction, said PIN diodes being controlled by a current, then additional DC bypass elements in parallel to the separate filters would be necessary, so that the same diode current could be used for the switches on both sides, in order to minimize the current consumption and the control circuitry.

The above described circuit of the first embodiment avoids all of these problems.

Also, an advantage of arranging the duplex filter 15 at the receiver terminal 13 of filter 1 lies in the fact that thereby a specification in terms of high input power for the duplex filter is not necessary. This is due to the fact that both bands provided by the duplex filter are receiver bands.

Figure 2:
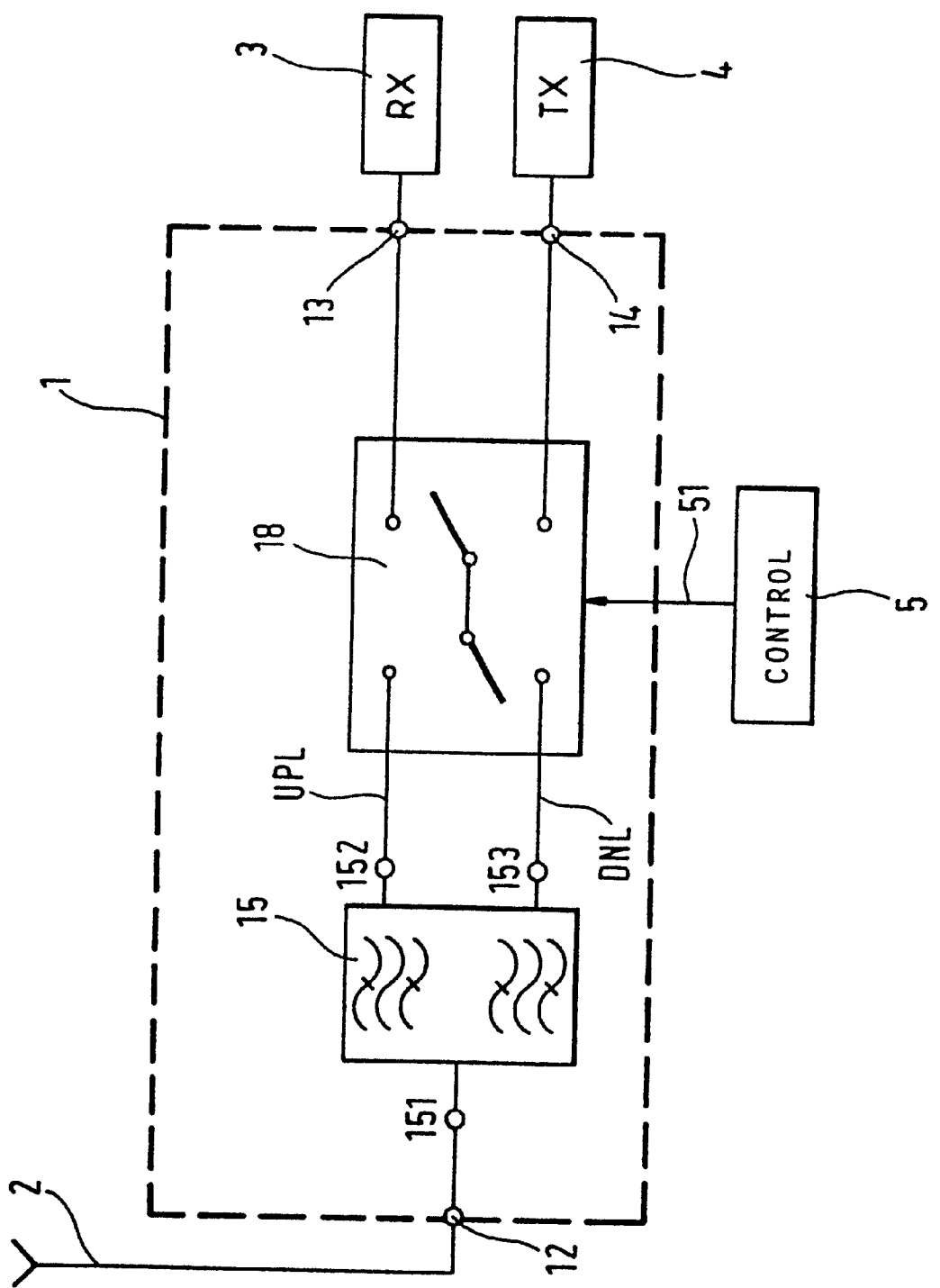
FIG. 2 shows a second embodiment of the invention.

A second embodiment of the present invention is shown in FIG. 2. Elements already described in connection with FIGS. 1 and 8 carry the same reference numerals and shall not be described again. As can be seen from FIG. 2, the difference to the first embodiment shown in FIG. 1 lies in the fact that the duplex filter 15 is now provided at the antenna terminal 12 of the filter 1. Also, a switching means 18 is provided, that acts as both an up-link/down-link and a transmitter/receiver switch.

In order to better explain the operation of the circuit shown in FIG. 2, it is assumed that the shown filter is being used in the fixed part of a cordless telephone system, and that therefore an up-link receiver branch, down-link receiver branch and a down-link transmitter branch need to be provided. In this connection it may already be noted that in the event of employing the filter in a mobile station in order to provide walkie-talkie features, the references "uplink" and "down-link" in FIGS. 1, 2 and 3 would simply have to be exchanged.

Returning to the example of an application to the fixed part of a cordless telephone system, the duplex filter provides an uplink characteristic between terminals 151 and 152, and a downlink characteristic between terminals 151 and 153. The controllable switch 18 is such that the uplink receiver characteristic is given if terminal 152 of duplex filter 15 is connected to terminal 13 of the filter, the down-link receiver characteristic is given if terminal 153 of the duplex filter 15 is connected to terminal 13 of filter 1, and the down-link transmitter characteristic is provided if terminal 153 is connected to transmitter terminal 14 of filter 1.

Figure 4:
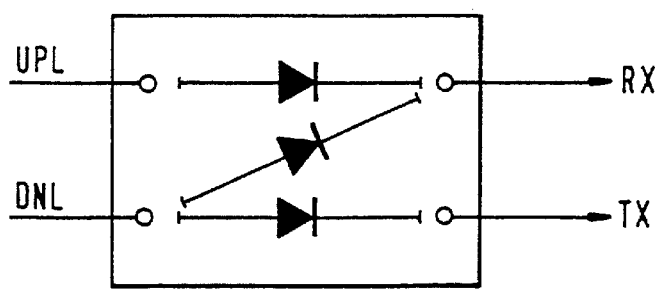
FIG. 4 schematically shows a controllable PIN diode switch.

As may be seen from this operation, the filter 18 can basically be of any suitable or desirable type, but preferably it has a fairly simple structure, e.g. as shown in FIG. 4 for the case of PIN diodes, as only the above mentioned three connections have to be switchable.

Naturally, as already mentioned in connection with FIG. 1, GaAs FETs can also be used as switching elements in the control switch 18.

Also as in the case of FIG. 1, the precise filter characteristics and frequency values used in duplex filter 15 depend on the individual preferences and requirements, but an example for an application to the above mentioned mobile stations and/or fixed part of a cordless telephone system would preferably lead to filter 15 having a first band pass characteristic around 902,5 MHz for the up-link, and a second band pass characteristic around 947,5 MHz for the down-link. These would be suitable frequencies for a GSM system.

Although the present invention can basically be applied in any frequency range, it is preferable that all of the filters and other elements be arranged to function in a frequency range between 500 and 6000 MHz.

As can be seen from the arrangement shown in FIG. 2, the filter 16 of the first embodiment (see FIG. 1) for the downlink transmission branch may be omitted. Consequently, the second embodiment provides the advantage of even less elements, and therefore saves cost and space.

Figure 3:
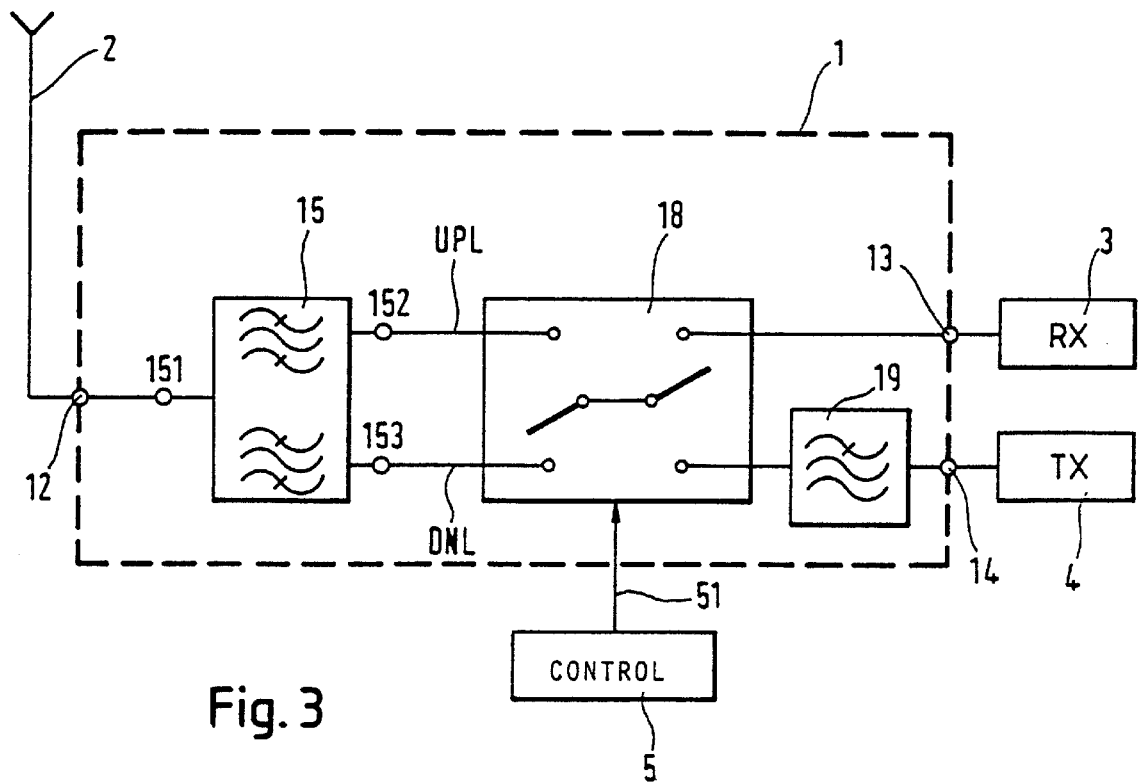
FIG. 3 shows a third embodiment of the invention.

On the other hand, the structure of FIG. 2 imposes higher demands on duplex filter 15, as the downlink filter has to fulfill both reception and transmission characteristics, i.e. an increased power specification, as well as the attenuation of harmonics. If it is desired to reduce the demands on the duplex filter 15, then the second embodiment of FIG. 2 can be modified in accordance with the third embodiment, shown in FIG. 3. The third embodiment of FIG. 3 is identical to that of FIG. 2, except that additionally a downlink transmission filter 19 has been incorporated between the transmitter terminal 14 of filter 1 and the controllable switch 18. The role and characteristics of filter 19 are identical to those of filter 16 used in the first embodiment shown in FIG. 1, so that a repeated description is not necessary.

Figure 5:
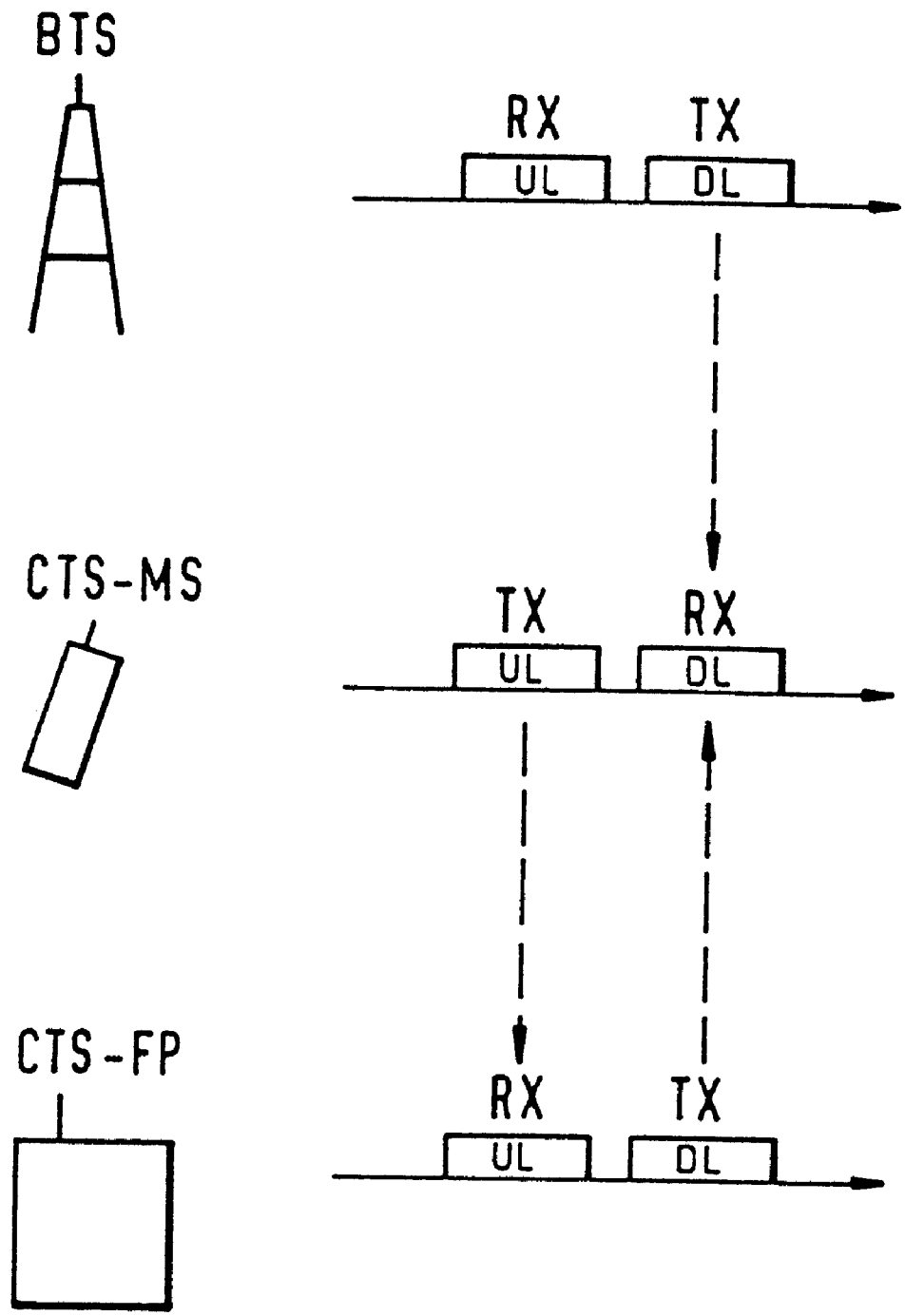
FIG. 5 is an explanatory diagram for indicating the transmission and reception along up-links and downlinks for a mobile station that can communicate with a cellular network and the fixed part of a cordless telephone system.
Figure 6:
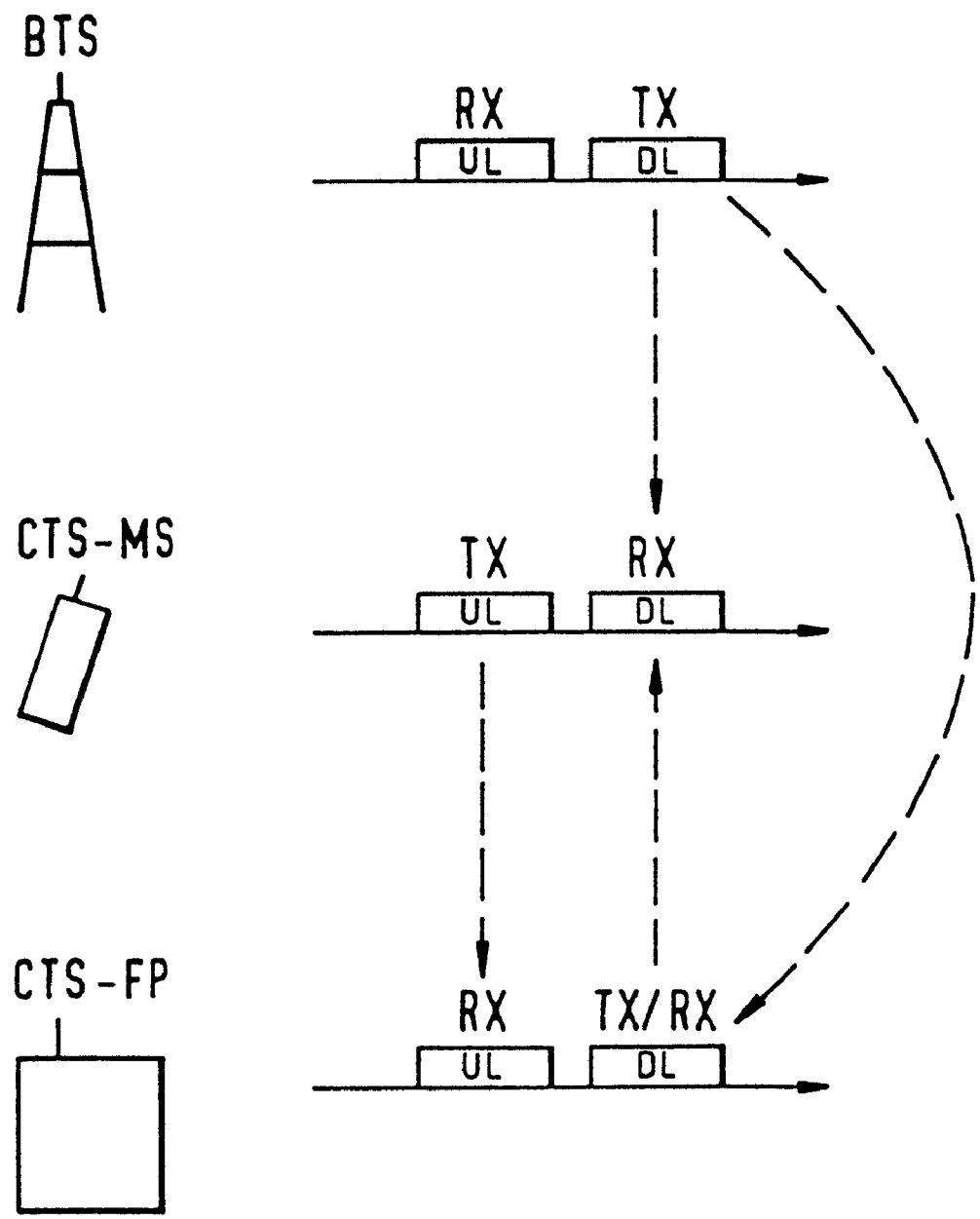
FIG. 6 is a diagram based on FIG. 5, in which additionally a reception function in the downlink band at the fixed part of the cordless telephone system is indicated.

As already mentioned previously, the use of "up-link" and "down-link" served the purpose of better explaining the operation of the invention in conjunction with what was described in FIGS. 5 and 6, but the present invention is by no means restricted thereto. For example, when applying the filter structure of the present invention to a mobile station in order to achieve walkie-talkie capabilities, then the reference UPL for up-link and DNL for down-link in FIGS. 1, 2 and 3 would have to be exchanged.

Also, although the present invention has been described in conjunction with specific embodiments, this serves the purpose of a complete and clear description, and by no means restricts the present invention, which is defined by the appended claims. Reference signs in the claims serve the purpose of enhancing understanding and do not restrict the scope of the claims.

What is claimed is:

1. A controllable filter for being interposed between an antenna on the one side and a receiver and a transmitter on the other side, comprising:

a first terminal leading to the antenna, a second terminal leading to the receiver, and a third terminal leading to the transmitter, wherein said controllable filter is capable of being controlled to selectively provide at least a first and a second filter characteristic with respect to frequency between said first terminal and said second terminal wherein said controllable filter comprises a duplex filter having a fourth, fifth and sixth terminal, wherein said duplex filter provides said first filter characteristic between said fourth and fifth terminals, and said duplex filter provides said second filter characteristic between said fourth and sixth terminals.

2. The controllable filter according to claim 1, wherein a third filter characteristic is provided between the first and third terminal, and the third filter characteristic and one of the first and second filter characteristics overlap with respect to the frequencies that said filter characteristics allow to pass.

3. The controllable filter according to claim 1, wherein said fourth terminal of said duplex filter is provided at said first terminal of said controllable filter.

4. The controllable filter according to claim 3, wherein a controllable switch is provided between said duplex filter and said second and third terminals of said controllable filter, said controllable filter being arranged to selectively connect or disconnect said fifth terminal and said second terminal, selectively connect or disconnect said sixth terminal and said second terminal, and selectively connect or disconnect said sixth terminal and said third terminal.

5. The controllable filter according to claim 4, wherein said duplex filter provides a bandpass characteristic between said fourth and said fifth terminals, and also provides a bandpass characteristic between said fourth and said sixth terminals.

6. The controllable filter according to claim 4, wherein said controllable switch comprises PIN diodes as controllable switching elements.

7. The controllable filter according to claim 4, wherein said controllable switch comprises GaAs field effect transistors as controllable switching elements.

8. The controllable filter according to claim 3, wherein another filter having a specified characteristic with respect to frequency is connected to said third terminal of said controllable filter, and a controllable switch is provided between said duplex filter one the one side of said second terminal of said controllable filter and said another filter, said controllable filter being arranged to:

selectively connect or disconnect said fifth terminal and said second terminal, selectively connect or disconnect said sixth terminal and said second terminal, and selectively connect or disconnect said sixth terminal and said another filter.

9. The controllable filter according to claim 8, wherein said another filter has a lowpass characteristic, and said duplex filter provides a bandpass characteristic between said fourth and fifth terminals, and also provides a bandpass characteristic between said fourth and said sixth terminals.

10. The controllable filter according to claim 1, said filter being arranged to function in the frequency range between 500 MHz and 6000 MHz.

11. The controllable filter according to claim 1, said filter being provided in the fixed part of a cordless telephony system.

12. The controllable filter according to claim 1, said filter being provided in the fixed part of a cordless telephony system, a third filter characteristic being provided between the first and third terminal, and the third filter characteristic and one of the first and second filter characteristics overlapping with respect to the frequencies that said filter characteristics allow to pass, where said first filter characteristic is associated with an uplink reception band, said second filter characteristic is associated with a downlink reception band, and said third filter characteristic is associated with a downlink transmission band.

13. The controllable filter according to claim 1, wherein said filter is provided in a mobile communication device.

14. The controllable filter according to claim 13, wherein said mobile communication device is a mobile telephone.

15. A cordless telephony system comprising a fixed part and a mobile part, wherein said fixed part comprises an antenna, a receiver, a transmitter and a controllable filter, said controllable filter having a first terminal leading to the antenna, a second terminal leading to the receiver and a third terminal leading to the transmitter, wherein the controllable filter is capable of being controlled to selectively provide at least a first and a second filter characteristic with respect to frequency between the first terminal and the second terminal;

wherein a third filter characteristic is provided between the first and third terminals, and the third filter characteristic and one of the first and second filter characteristics overlap with respect to the frequencies that said filter characteristics allow to pass, where said first filter characteristic is associated with an uplink reception band, said second filter characteristic is associated with a downlink reception band, and said third filter characteristic is associated with a downlink transmission band.

* * * * *